United States Patent [19]

Seto

[11] Patent Number: 5,191,599

[45] Date of Patent: Mar. 2, 1993

[54] CONTROL DEVICE FOR A CHARGE DETECTION CIRCUIT

[75] Inventor: Toshiki Seto, Kamakura, Japan

[73] Assignee: Mitsubishi Denki Kabushiki Kaisha, Japan

[21] Appl. No.: 790,588

[22] Filed: Nov. 8, 1991

[30] Foreign Application Priority Data

Nov. 9, 1990 [JP] Japan .................................. 2-304396

[51] Int. Cl.⁵ .................... H01L 29/78; G11C 19/28
[52] U.S. Cl. ........................................ 377/60; 377/58;
377/59; 377/63; 257/239
[58] Field of Search ...................... 377/57-63;
357/24; 358/213.18, 213.19, 213.23, 213.26;
307/607, 353; 328/127

[56] References Cited

U.S. PATENT DOCUMENTS

| | | | |
|---|---|---|---|
| 4,603,426 | 7/1986 | Sauer | 377/60 |
| 4,719,512 | 1/1988 | Endo et al. | 358/213.26 |
| 4,811,371 | 3/1989 | Tower | 377/60 |
| 4,974,239 | 11/1990 | Miwada | 377/60 |
| 4,998,265 | 3/1991 | Kimata | 377/60 |

FOREIGN PATENT DOCUMENTS

WO84/03017  1/1984  PCT Int'l Appl.

Primary Examiner—William L. Sikes
Assistant Examiner—Tai V. Duong
Attorney, Agent, or Firm—Wolf, Greenfield & Sacks

[57] ABSTRACT

A control device for a charge detection circuit comprising a CCD final gate electrode formed on a semiconductor substrate, an electric potential barrier forming gate electrode placed adjacent to the CCD final gate electrode, a diffusion region formed adjacent to the electric potential barrier forming gate electrode, a reset transistor connected to the diffusion region, a source follower circuit which uses as an input an electric potential in the diffusion region, a sample and hold circuit for receiving the output of the source follower circuit at a specified timing, a reference voltage source which has a value determined by the dynamic range of the source follower circuit, and an integrator which integrates a difference between the output of the sample and hold circuit and the output of the reference voltage source, and applies a value obtained by the integration to the electric potential barrier forming gate electrode.

3 Claims, 7 Drawing Sheets

FIG. 1
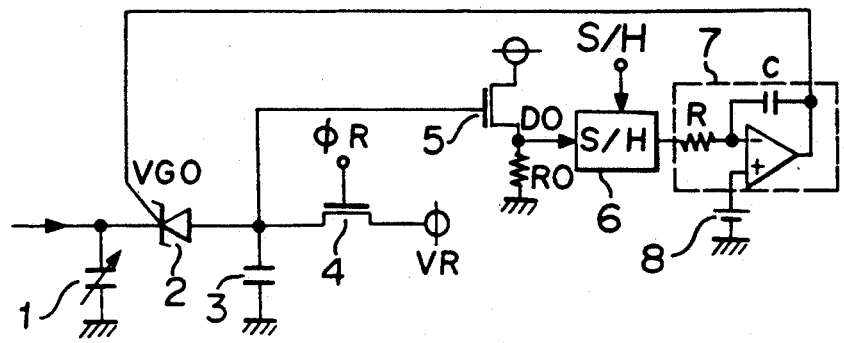
FIG.1(a)
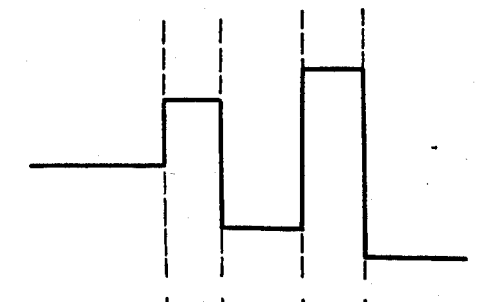
FIG.1(b)
FIG.1(c)
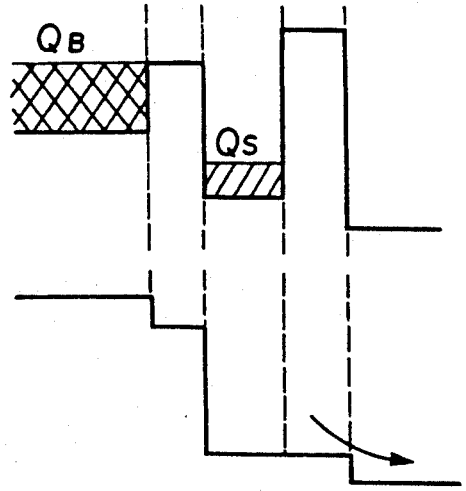

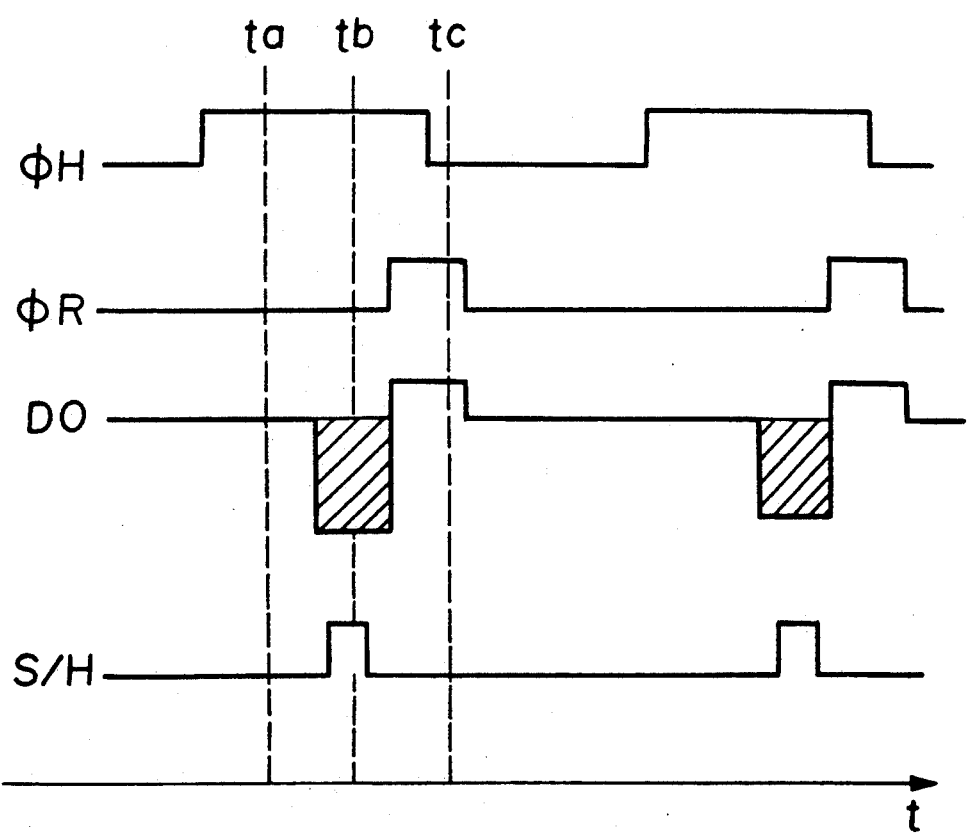

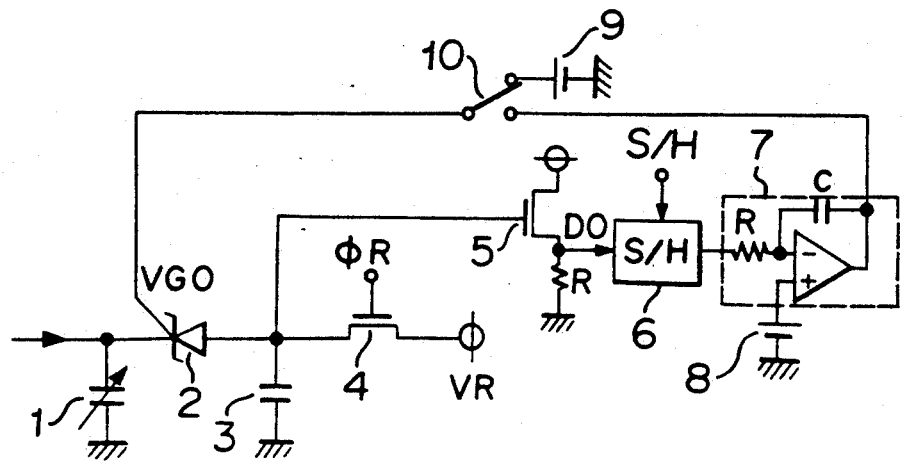
FIG. 3
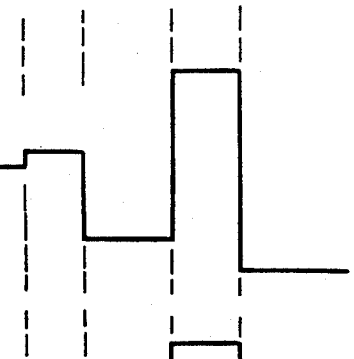
FIG. 3(a)
FIG. 3(b)
FIG. 3(c)

FIG. 4
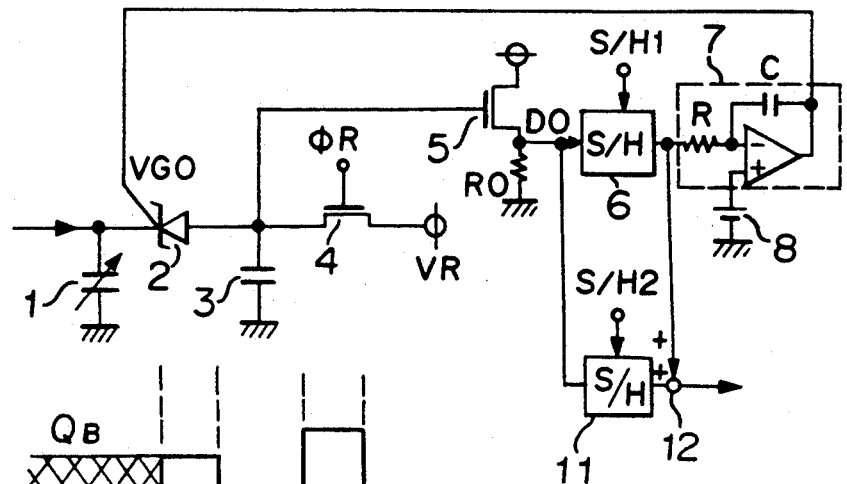
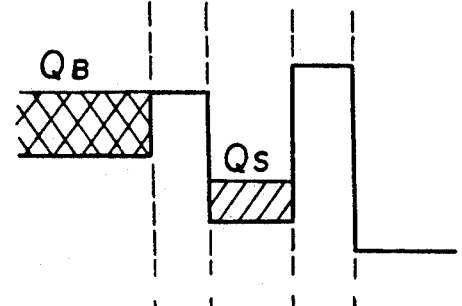
FIG 4(a)
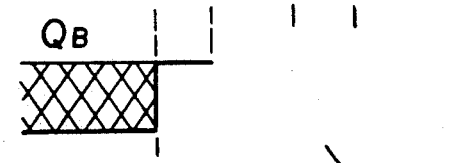
FIG.4(b)
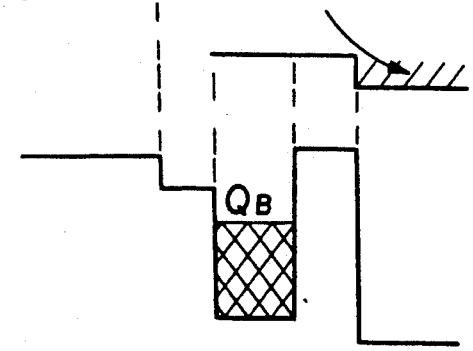
FIG.4(c)
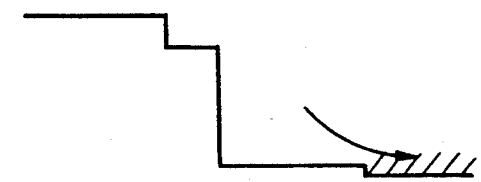
FIG.4(d)

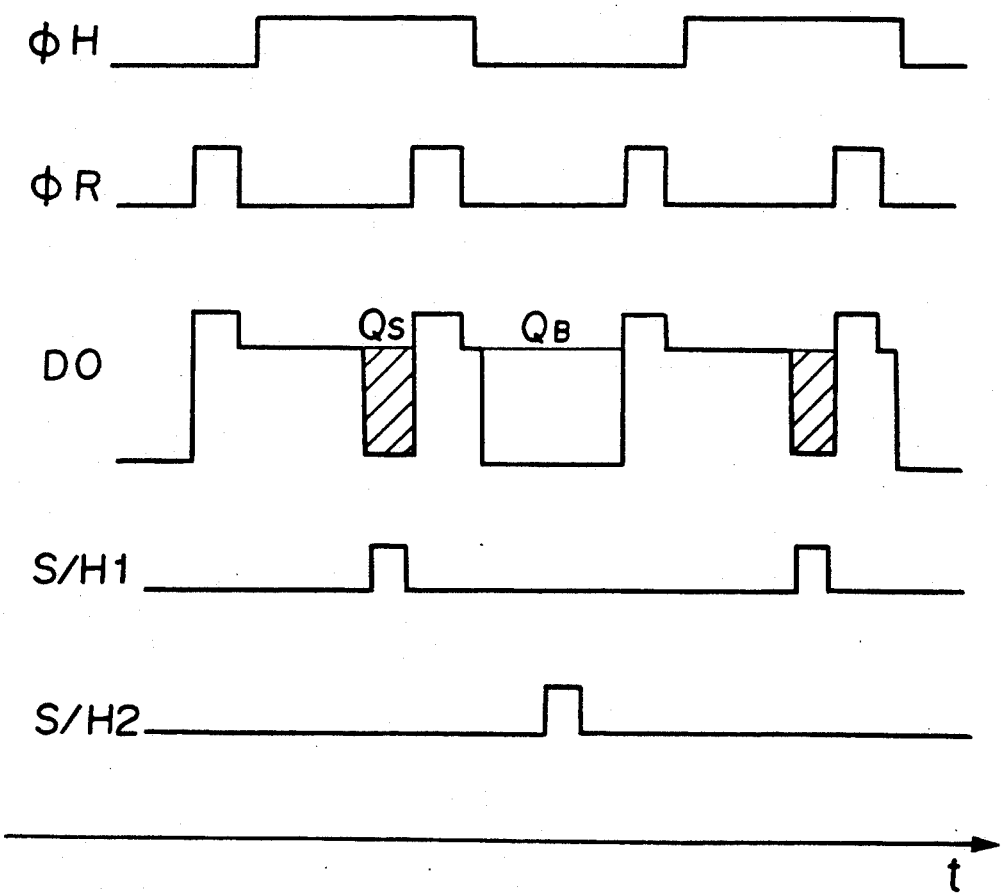

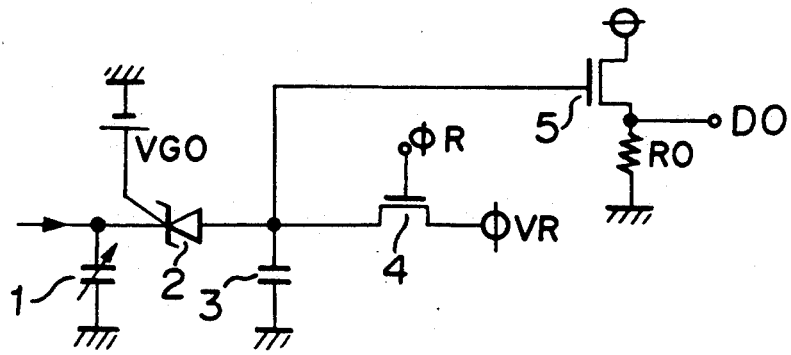
FIG. 6
(PRIOR ART)
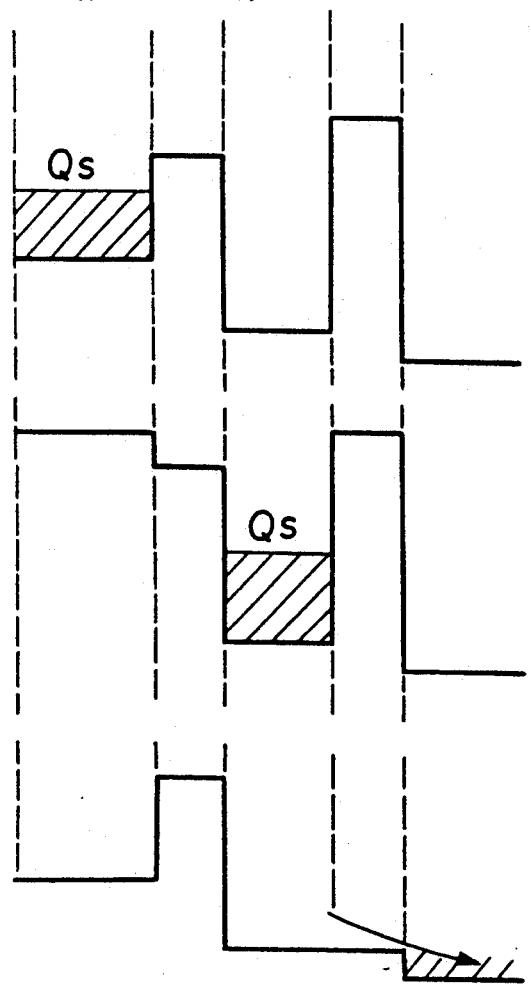
FIG. 6(a)
FIG. 6(b)
FIG. 6(c)

CONTROL DEVICE FOR A CHARGE DETECTION CIRCUIT

BACKGROUND OF THE INVENTION

1. Field of the Invention

The present invention relates to an improved control device for a charge detection circuit used as an output circuit for a CCD such as a solid-state image pick-up device.

2. Discussion of Background

There has been known a charge detection circuit called a floating diffusion amplifier as an output circuit for a CCD such as a solid-state image pick-up device.

FIG. 6 shows a conventional charge detection circuit wherein reference numeral 1 designates a CCD final gate electrode, numeral 2 designates an electric potential barrier forming gate, numeral 3 designates a diffusion region, numeral 4 designates a resetting transistor and numeral 5 designates a source follower circuit. The lower part of FIG. 6 shows the electric potential levels at respective portions. The waveform of signals which are shown in FIG. 6 at (a), (b) and (c) respectively correspond to the timing of $t_a$, $t_b$ and $t_c$ in the timing chart shown in FIG. 7. In FIGS. 6 and 7, symbols $\phi H$, $\phi R$ and D0 respectively represent a CCD final gate potential level, a resetting transistor gate potential level and a source follower circuit output level.

In the conventional charge detection circuit as shown in FIG. 6, an electric charge Qs transferred from the CCD is stored in the CCD final gate electrode 1 in the timing $t_a$. In the timing $t_b$, the electric charge Qs passes through the electric potential barrier forming gate electrode, diffuses, moves and is stored in the diffusion region 3 since the electric potential of the CCD final gate electrode 1 decreases, and the stored capacity disappeared. Then, the output D0 of the source follower circuit 5 has an output voltage of the level corresponding to the electric charge Qs. At a timing tc, the reset transistor 4 becomes in an ON state so that the electric charge Qs stored in the diffusion region 3 is discharged to an outer power source VR. Then, the preparation for storing another electric charge is completed.

In the conventional charge detection circuit described above, when, for instance, the sensitivity of the detector of a solid-state image pick-up element is increased so that an amount of electric charge becomes large, or the capacity of the diffusion region is made small in order to improve the gain of the floating diffusion amplifier, the amplitude of the output of the source follower circuit becomes large, whereby the output of the source follower circuit may reach the saturated level.

SUMMARY OF THE INVENTION

It is an object of the present invention to provide a control device for a charge detection circuit which allows the operation of the source follower circuit without reaching its saturation level even when an amount of electric charge generated becomes large, or the capacity of the diffusion region is made small.

In an aspect of the present invention, there is provided a control device for a charge detection circuit comprising a CCD final gate electrode formed on a semiconductor substrate, an electric potential barrier forming gate electrode placed adjacent to the CCD final gate electrode, a diffusion region formed adjacent to the electric potential barrier forming gate electrode, a reset transistor connected to the diffusion region, a source follower circuit which uses as an input an electric potential in the diffusion region, a sample and hold circuit for receiving the output of the source follower circuit at a specified timing, a reference voltage source which has a value determined by the dynamic range of the source follower circuit, and an integrator which integrates a difference between the output of the sample and hold circuit and the output of the reference voltage source, and applies a value obtained by the integration to the electric potential barrier forming gate electrode.

In another aspect of the present invention, there is provided a control device for a charge detection circuit comprising a CCD final gate electrode formed on a semiconductor substrate, an electric potential barrier forming gate electrode placed adjacent to the CCD final gate electrode, a diffusion region formed adjacent to the electric potential barrier forming gate electrode, a reset transistor connected to the diffusion region, a source follower circuit which uses as an input an electric potential in the diffusion region, a sample and hold circuit for receiving the output of the source follower circuit at a specified timing, a first reference voltage source which has a value determined by the dynamic range of the source follower circuit, an integrator which integrates a difference between the output of the sample and hold circuit and the output of the first reference voltage source, a second reference voltage source, and a change-over switch which selects either the output of the integrator or the second reference voltage source to apply the selected output to the electric potential barrier forming gate electrode.

In another aspect of the present invention, there is provided a control device for a charge detection circuit comprising a CCD final gate electrode formed on a semiconductor substrate, an electric potential barrier forming gate electrode placed adjacent to the CCD final gate electrode, a diffusion region formed adjacent to the electric potential barrier forming gate electrode, a reset transistor connected to the diffusion region, a source follower circuit which uses as an input an electric potential in the diffusion region, first and second sample and hold circuits for receiving the output of the source follower circuit at a specified timing, a reference voltage source which has a value determined by the dynamic range of the source follower circuit, an integrator which integrates a difference between the output of the first sample and hold circuit and the output of the reference voltage source, and applies a value obtained by the integration to the electric potential barrier forming gate electrode, and an adder for summing the outputs of the first and second sample and hold circuits.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a circuit diagram of an embodiment of the control device for a charge detection circuit according to the present invention;

FIG. 2 is a timing chart for explaining the operation of the first embodiment of the present invention;

FIG. 3 is a diagram of a second embodiment of the control device according to the present invention;

FIG. 4 is a diagram of a third embodiment of the control device according to the present invention;

FIG. 5 is a timing chart for explaining the operation of the third embodiment of the present invention;

FIG. 6 is a diagram showing a conventional charge detection circuit; and

DETAILED DESCRIPTION OF THE PREFERRED EMBODIMENTS

Figure 7:
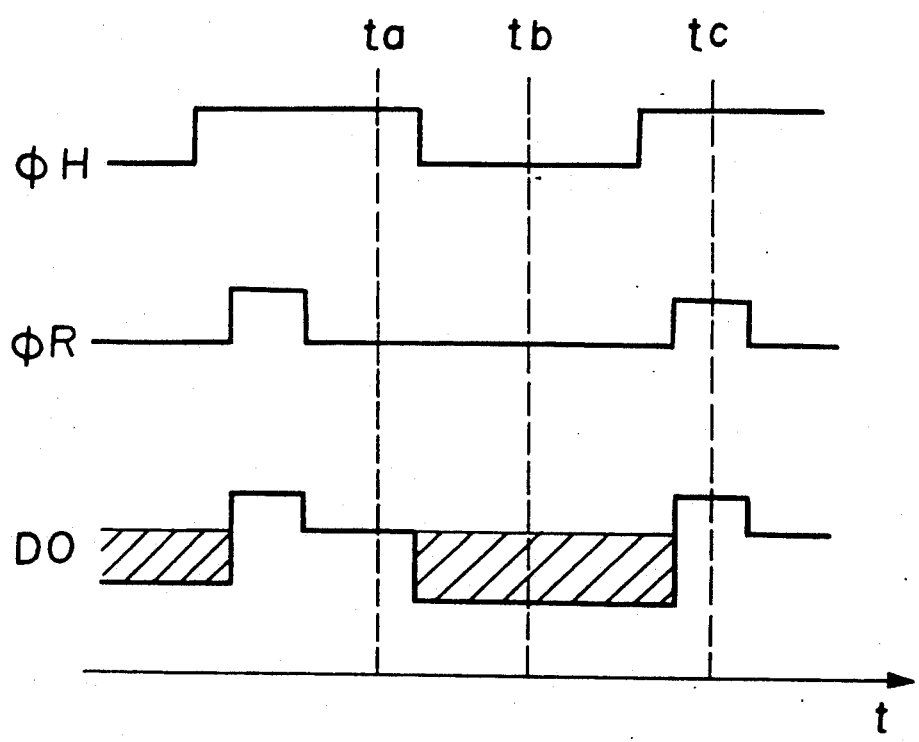
FIG. 7 is a timing chart for explaining the operation of the conventional charge detection circuit.

Referring to the drawings wherein the same reference numerals as those in FIGS. 6 and 7 designate the same or corresponding parts, and more particularly to FIG. 1, there is shown an embodiment of the control device for a charge detection circuit of the present invention. In FIG. 1, reference numeral 6 designates a sample and hold circuit, numeral 7 designates an integration circuit and numeral 8 designates a reference voltage source.

In the control device for a charge detection circuit having the construction described above, the CCD final gate electrode 1, the electric potential barrier forming gate electrode 2, the diffusion region 3, the reset transistor 4 and the source follower circuit 5 respectively perform the same function as those of the conventional control device.

Potential levels at the corresponding elements of the device are indicated at the lower portion of FIG. 1 wherein the signal waveforms at (a), (b) and (c), respectively correspond to the states at each timing ta, tb, tc in the timing chart as shown in FIG. 2.

In FIGS. 1 and 2, the electric potential barrier between the CCD final gate electrode 1 and the diffusion region 3 can be raised or lowered by controlling a signal level VGO to be applied to the electric potential barrier forming gate electrode. Assuming that the value of barrier is made sufficiently small, an electric charge transferred from the CCD overflows from the CCD final gate and flows beyond the electric potential barrier so that an overflowed electric charge is stored in the diffusion region 3 (FIG. 1(b)). In consideration that in an image pick-up element such as a solid-state image pick-up device, an amount of background output $Q_B$ in the entirety of picture plane is in many cases unnecessary but only a change component of a signal Qs is often required, it is no problem that only the change component of signal Qs which overflows from the electric potential barrier is taken as a signal, and the amount of background output $Q_B$ is discharged through the reset transistor 4. In this case, if a signal component which is required and the background output component which is unnecessary are outputted at separate time, saturation in the source follower circuit 5 can be prevented.

The above-mentioned principle of operation is utilized in the present invention. Namely, the value of electric potential barrier which determines the background output quantity $Q_B$ is controlled by providing a feed-back circuit, so that the average value of the output of the charge detection circuit can be a constant value.

The output D0 of the electric detection circuit is sampled and held by the sample and hold circuit 6 connected at the rear stage of the detection circuit at a timing shown in FIG. 2.

A difference between the output of the sample and hold circuit 6 and the output of the reference voltage source 8 is integrated by the integration circuit 7, and an output obtained by integration is applied to the electric potential barrier forming gate electrode 2. Thus, the electric potential barrier can be controlled so that the output of the sample and hold circuit 6 becomes an equal voltage level to that of the reference voltage source 8. In this case, the time constant of integration of the integrator 7 is determined by the value of R and C in FIG. 1. When the control device is used for a solid-state image pick-up element, the time constant is determined to be a value corresponding to several frames and the signal is subjected to feed-back control so that there is no flicker on the picture screen.

As described above, by determining the value of the reference voltage source 8 to be a level which does not cause the saturation of the source follower circuit 5, the electric potential barrier can be controlled so as not to cause the saturation of the source follower circuit 5 and to operate it properly regardless of an amount of electric charge.

For instance, when the detection circuit of the present invention is used for a solid-state image pick-up device, the image-pick-up of an object can be achieved without causing the saturation of the picture plane even when there is a change in a background level.

The above-mentioned embodiment is for preventing the source follower circuit 5 from saturation.

FIG. 3 shows an embodiment of the present invention whose purpose is to enlarge the dynamic range of an incident light quantity when the control device for a charge detection circuit is used for a solid-state image pick-up device.

In FIG. 3, reference numeral 9 designates a second reference voltage source and numeral 10 designates a change-over switch. The elements 1-8 in the control device shown in FIG. 3 perform operations similar to those of the embodiments as shown in FIG. 1.

In FIG. 3, when a voltage level to be applied to the electric potential barrier forming gate electrode is controlled so that the potential barrier is made small, the electric charge of a signal transferred from the CCD is always stored bridging both areas of the CCD final gate electrode 1 and the diffusion region 3 (FIG. 3(b)). This means that the capacity of the diffusion region 3 is enlarged in equivalence, and the dynamic range can also be enlarged. In this case, however, it goes without saying that the output voltage per electric charge is smaller than that of normal operation.

The second embodiment of the present invention utilizes the above-mentioned principle of operation. As shown in FIG. 3, the value of the second reference voltage source 9 is so determined as to provide an electric potential barrier level whereby the electric charge of a signal is always stored bridging both areas of the CCD final gate electrode 1 and the diffusion region 3. By connecting the change-over switch 10 to the terminal of the second reference voltage source side, the gain at the electric potential barrier can be small while the dynamic range can be enlarged. When it is desired that the dynamic range is small while the gain is large, the change-over switch 10 should be connected to the output side of the integrator 7, whereby the same control as that described with reference to the first embodiment of FIG. 1 is obtainable.

The change-over switch 10, when the construction as shown in FIG. 3 is used for, for instance, a solid-state image pick-up device, can select either that the contrast of a display is increased or the range of brightness in the display is widened.

In the embodiments as shown in FIGS. 1 and 3, the background output component $Q_B$ is canceled as an unnecessary component. However, there is a case that the absolute value of an electric charge transferred from the CCD is required. For instance, in a case using a solid-state image pick-up device, not only the contrast of an object to be image-picked-up but also the brightness is required, for instance. Namely, there is a case requiring a d.c. restoration function.

FIG. 4 shows a third embodiment of the present invention which is provided with the d.c. restoration function, wherein reference numeral 11 designate a second sample and hold circuit and numeral 12 designates an adder. The elements 1–8 perform the same function as the elements having the same reference numerals.

In FIG. 4, a difference between the output of the first sample and hold circuit 6 and the output of the first reference voltage source 8 are applied to the electric potential barrier forming gate electrode 2 in the same manner as described with reference to the embodiment shown in FIG. 1.

The output voltage D0 which corresponds to the signal component Qs overflowing from the electric potential barrier is sampled and held by the first sample and hold circuit 6, and then, the reset transistor 4 is brought into an ON state so that the signal component Qs stored in the diffusion region 3 is reset (FIG. 4(b)). Then, the output voltage D0 corresponding to the background output component $Q_B$ is sampled and held by the second sample and hold circuit 11. And then, the output of the first sample and hold circuit 8 and the output of the second sample and hold circuit 11 are summed by the adder 12, whereby the absolute value of the electric charge transferred from the CCD is obtained; thus, d.c. restoration is possible.

Thus, in the third embodiment of the present invention, when the control device for a charge detection circuit of the present invention is used for, for instance, a solid-state image pick-up device, not only the contrast between an object and the background, but also the brightness of the object itself can be obtained.

As described above, according to the present invention, a charge detection circuit which prevents the source follower circuit from saturation can be realized by properly controlling an electric potential barrier level formed at the following stage of the CCD final gate electrode.

Obviously, numerous modifications and variations of the present invention are possible in light of the above teachings. It is therefore to be understood that within the scope of the appended claims, the invention may be practiced otherwise than as specifically described herein.

What is claimed is:

1. A control device for a charge detection circuit comprising:
   a CCD final gate electrode formed on a semiconductor substrate,
   an electric potential barrier forming gate electrode placed adjacent to said CCD final gate electrode,
   a diffusion region formed adjacent to said electric potential barrier forming gate electrode,
   a reset transistor connected to said diffusion region,
   a source follower circuit which uses as an input an electric potential in said diffusion region,
   a sample and hold circuit for receiving the output of said source follower circuit at a specified timing,
   a reference voltage source which has a value determined by the dynamic range of said source follower circuit, and
   an integrator which integrates a difference between the output of said sample and hold circuit and the output of said reference voltage source, and applies a value obtained by the integration to said electric potential barrier forming gate electrode.

2. A control device for a charge detection circuit comprising:
   a CCD final gate electrode formed on a semiconductor substrate,
   an electric potential barrier forming gate electrode placed adjacent to said CCD final gate electrode,
   a diffusion region formed adjacent to said electric potential barrier forming gate electrode,
   a reset transistor connected to said diffusion region,
   a source follower circuit which uses as an input an electric potential in said diffusion region,
   a sample and hold circuit for receiving the output of said source follower circuit at a specified timing,
   a first reference voltage source which has a value determined by the dynamic range of said source follower circuit,
   an integrator which integrates a difference between the output of said sample and hold circuit and the output of said first reference voltage source,
   a second reference voltage source, and
   a change-over switch which selects either output of said integrator or said second reference voltage source to apply the selected output to said electric potential barrier forming gate electrode.

3. A control device for a charge detection circuit comprising:
   a CCD final gate electrode formed on a semiconductor substrate,
   an electric potential barrier forming gate electrode placed adjacent to said CCD final gate electrode,
   a diffusion region formed adjacent to said electric potential barrier forming gate electrode,
   a reset transistor connected to said diffusion region,
   a source follower circuit which uses as an input an electric potential in said diffusion region,
   first and second sample and hold circuits for receiving the output of said source follower circuit at a specified timing,
   a reference voltage source which has a value determined by the dynamic range of said source follower circuit,
   an integrator which integrates a difference between the output of said first sample and hold circuit and the output of said reference voltage source, and applies a value obtained by the integration to said electric potential barrier forming gate electrode, and
   an adder for summing the outputs of said first and second sample and hold circuits.

* * * * *